United States Patent [19]

Sakurai

[11] Patent Number: 4,489,478
[45] Date of Patent: Dec. 25, 1984

[54] PROCESS FOR PRODUCING A THREE-DIMENSIONAL SEMICONDUCTOR DEVICE

[75] Inventor: Junji Sakurai, Tokyo, Japan

[73] Assignee: Fujitsu Limited, Kawasaki, Japan

[21] Appl. No.: 425,644

[22] Filed: Sep. 28, 1982

[30] Foreign Application Priority Data

Sep. 29, 1981 [JP] Japan ................................ 56-154613
Sep. 29, 1981 [JP] Japan ................................ 56-154614
Oct. 19, 1981 [JP] Japan ................................ 56-167370

[51] Int. Cl.$^3$ .......................................... H01L 21/66
[52] U.S. Cl. .................................. 29/574; 29/577 C; 148/1.5
[58] Field of Search ...................... 29/574, 577 C, 571, 29/576 B; 148/1.5

[56] References Cited

U.S. PATENT DOCUMENTS 4,144,493 3/1979 Lee et al. ........................ 29/574 X

FOREIGN PATENT DOCUMENTS 36137 9/1981 European Pat. Off. .

Primary Examiner—Brian E. Hearn
Assistant Examiner—Alan E. Schiavelli
Attorney, Agent, or Firm—Staas & Halsey

[57] ABSTRACT

At present, the majority of semiconductor devices are two-dimensional large-scale integration (LSI) semiconductor devices in which the semiconductor elements are arranged in a semiconductor layer in a two-dimensional manner. An aim of the techniques of production of semiconductor devices is to achieve, in the future, a super high integration amounting to 16 M bits or more per chip. For attaining such a super high integration, a multilayer semiconductor device must be produced. A method for producing a three-dimensional LSI semiconductor device prevents wasteful formation of semiconductor layers and insulating films. The method includes the step of forming, in a first semiconductor layer, a monitoring device for evaluating the circuit function of the semiconductor elements in the first semiconductor layer and subsequently forming another semiconductor layer above the first semiconductor layer. A preferred embodiment also includes the steps of: forming the impurity regions of the semiconductor elements by ion implantation; activating the implanted impurity ions by energy beam irradiation; and forming the insulating material regions of the semiconductor elements by high-pressure oxidation, or by low-temperature sputtering.

9 Claims, 13 Drawing Figures

PROCESS FOR PRODUCING A THREE-DIMENSIONAL SEMICONDUCTOR DEVICE

BACKGROUND OF THE INVENTION

The present invention relates to a process for producing a semiconductor device. More particularly, the present invention relates to a process for producing a three-dimensional integrated semiconductor device in which a plurality of semiconductor layers with sandwiched insulating film(s) are formed on a substrate.

At present, the majority of semiconductor devices are two-dimensional large-scale integration (LSI) semiconductor devices in which the semiconductor components are arranged in a semiconductor layer in a two-dimensional manner. In the case of memory devices, improvements of high-integration delineating techniques and other production process techniques have made it possible to industrially produce high integration semiconductor devices which, in the case of memory devices, have a memory capacity of 64 K bits or more.

An aim of the techniques of production of semiconductor devices is to achieve, in the future, a super high integration of 16M bits or more per chip. For attaining such a super high integration, a multilayer semiconductor device comprising eight to ten semiconductor layers must be produced. In such a multilayer semiconductor device, hereinafter referred to as a three-dimensional LSI semiconducctor device, the semiconductor elements, formed in, for example, from eight to ten semiconductor layers, are electrically connected to produce one particular circuit, e.g., a memory circuit. The circuit cannot function if even part of the circuit formed in one semiconductor layer does not function normally.

If in the production of a three-dimensional LSI semiconductor device the circuit function is evaluated after formation of the multilayer semiconductor device and if in only one semiconductor layer the circuit is not normal, the wasteful formation of seven to nine semiconductor layers is unavoidable. It is crucial to solve this problem so that three-dimensional LSI semiconductor devices can be produced with a high yield. The prior art has not tried to solve this problem.

SUMMARY OF THE INVENTION

It is an object of the present invention to provide a reliable process for producing a three-dimensional LSI semiconductor device and to prevent the wasteful formation of semiconductor layers and insulating films.

The basic concept of the present invention resides in forming, in a first semiconductor layer, a monitoring device for evaluating the circuit function of the semiconductor elements in the first semiconductor layer, and subsequently forming another semiconductor layer above the first semiconductor layer.

In one embodiment of the present invention, there is provided a process for producing a three-dimensional LSI semiconductor device comprising a substrate, first and second semiconductor layers formed on the substrate, and an insulating film formed between the first and second semiconductor layers for insulating the layers from one another, the process comprising the steps of:
preparing the substrate;
forming the first semiconductor layer on the substrate;
forming in the first semiconductor layer a first group of circuit elements including a plurality of semiconductor elements, as well as a monitoring device for monitoring properties of the circuit elements;
measuring the properties of the monitoring device, thereby evaluating a circuit function of the semiconductor elements;
forming the insulating film on the first semiconductor layer;
forming the second semiconductor layer on the insulating film;
forming the second group of circuit elements, including a plurality of semiconductor elements in the second semiconductor layer; and
electrically connecting at least one of the semiconductor components included in the first group of circuit elements with at least one of the semiconductor elements included in the second group of circuit elements.

The present invention is hereinafter explained with reference to the drawings.

DESCRIPTION OF THE PREFERRED EMBODIMENTS

First, a process of the present invention is described with reference to FIGS. 1 and 2. In this process, a plurality of chips are formed in the form of a matrix, and the monitoring device is manufactured in at least one of the plurality of chips. The other chips are used for forming three-dimensional LSI semiconductor devices. The circuit function of the first semiconductor layer is evaluated, and then the second semiconductor layer is formed.

Figure 1:
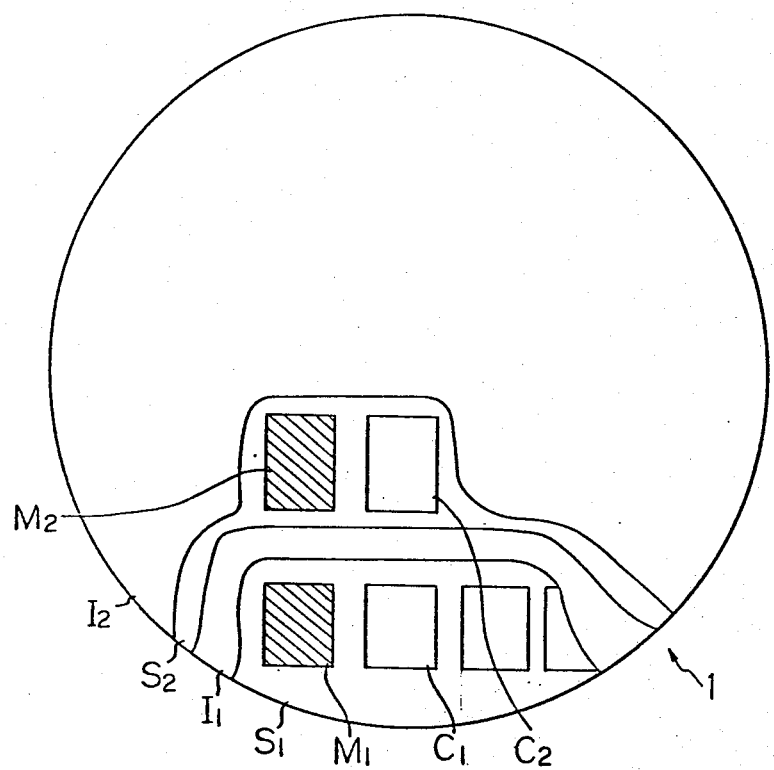
FIG. 1 is a schematic of a partial cross-sectional view of a three-dimensional LSI semiconductor device.

Referring to FIG. 1, a first semiconductor layer $S_1$ is formed on a substrate 1 in the form of a wafer by means of a known epitaxial growth method. In every region of the chip $C_1$, MOS transistors, MOS capacitors, bipolar transistors, diffusion resistors, diodes, isolation regions (not shown), and other semiconductor elements are formed.

Simultaneous with the formation of the semiconductor elements, a monitoring device $M_1$ is formed in at least one region of the chip $C_1$. A monitoring device formed in a chip is known as a plug bar. Only one monitoring device $M_1$ is shown in FIG. 1.

A first insulating film $I_1$ is then formed on the first semiconductor layer $S_1$ and then electrode windows (not shown) and metal conductors (not shown) are formed to connect the monitoring device $M_1$ and the semiconductor elements in a two- or three-dimensional manner. A second semiconductor layer $S_2$ comprising a chip $C_2$ and a monitoring device $M_2$ is similarly formed, followed by the formation of a second insulating film $I_2$. Chips and monitoring devices (not shown) are similarly formed in third and subsequent semiconductor layers.

Figure 2:
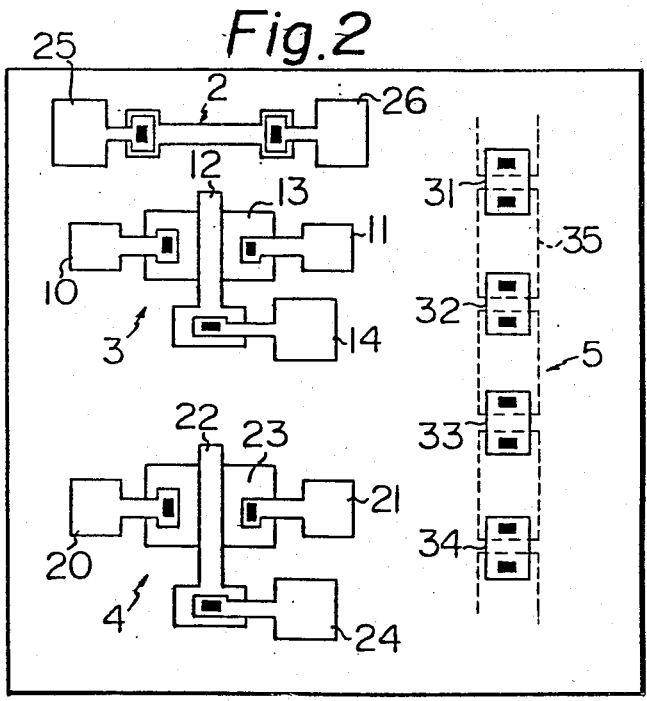
FIG. 2 is an enlarged view of the monitoring device of FIG. 1.

Referring to FIG. 2, all of the components of the monitoring device $M_1$ are shown. The elements of the monitoring device $M_1$ are, for example, a diffusion resistor 2, an ordinary MOS transistor 3, a MOS transistor, (the gate oxide film which serves as the field insulating film of the three-dimensional LSI semiconductor device) hereinafter referred to as field MOS transistor 4, and resistors 5 formed by connecting the contact regions of a three-dimensional LSI semiconductor device in series. The ordinary MOS transistor 3 is manufactured under the same conditions as and simultaneous with the MOS transistors (not shown) of the three-dimensional LSI semiconductor devices formed in the chip $C_1$ (FIG. 1). The gate oxide film of the field MOS transistor 4 is formed under the same conditions as and simultaneous with the field insulating films (not shown) of the three-dimensional LSI semiconductor devices formed in the chip $C_1$ (FIG. 1). The resistors 5 are manufactured under the same conditions as and simultaneous with the contact regions (not shown) of the three dimensional LSI semiconductor devices formd in the chip $C_1$ (FIG. 1). The other semiconductor elements, e.g., MOS capacitors and bipolar transistors, may be manufactured in the monitoring device $M_1$ under the same conditions as and simultaneous with said other elements of the three-dimensional LSI semiconductor devices in the chip $C_1$ (FIG. 1).

The ordinary MOS transistor 3 and the field MOS transistor 4 (FIG. 2) comprise pads 10 and 20 of the source region, pads 11 and 21 of the drain region, gate regions 12 and 22 made of gate insulating film and polycrystalline silicon electrodes, and gate-contact pads 14 and 24. An insulating film (not shown) is formed around the source- and drain-diffusion regions 13 and 23, respectively, so as to isolate the ordinary MOS transistor 3 and the field MOS transistor 4 from one another. The diffusion resistor 2 is provided at its ends with pads 25 and 26 for contacting with a measuring probe (not shown). The parts 31, 32, 33, and 34 of the resistors 5 are connected in series by leads 35 which are formed on the first insulating film $I_1$ (FIG. 1). The black areas in FIG. 2 indicate the windows in the first insulating film $I_1$ (FIG. 1). The leads, of which only the leads 35 are shown by the dotted lines, are connected to the semiconductor elements through the windows.

By using the monitoring device $M_1$ (FIG. 2), the resistance of the diffusion resistor 2 and the resistors 5, as well as the threshold voltage $V_{TH}$, the mutual conductance (gm), and the source-drain break down voltage $BV_{SD}$, can be measured. As a result, it is possible to evaluate whether or not the circuit function of the semiconductor elements formed in the first semiconductor layer $S_1$ (FIG. 1) is normal.

Referring again to FIG. 1, when the circuit function of the semiconductor elements formed in the first semiconductor layer $S_1$ is normal, the second semiconductor layer $S_2$ and the second insulating film $I_2$ are manufactured in a similar fashion, and, subsequently, by using the monitoring device $M_2$ it can be estimated whether or not the circuit function of the semiconductor elements formed in the second semiconductor layer $S_2$ is normal. The circuit function of the electrodes and conductors of the three-dimensional LSI semiconductor device is usually evaluated by using the resistors 5 (FIG. 2).

Figure 4:
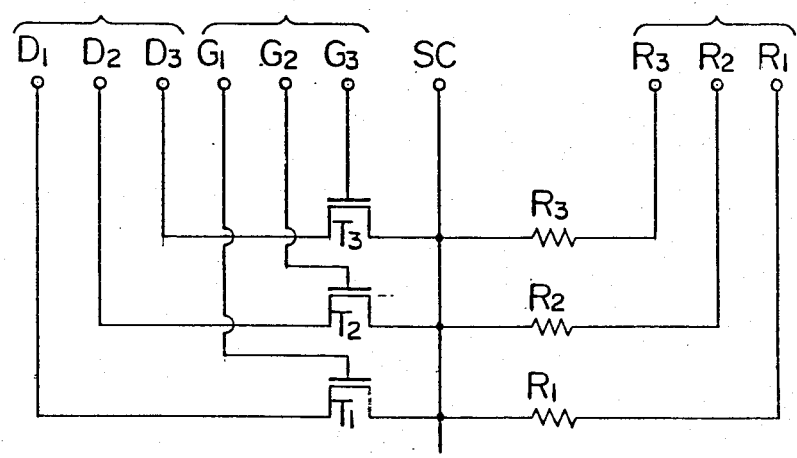
FIG. 4 is a circuit equivalent to the monitoring device shown in FIG. 3.
Figure 3:
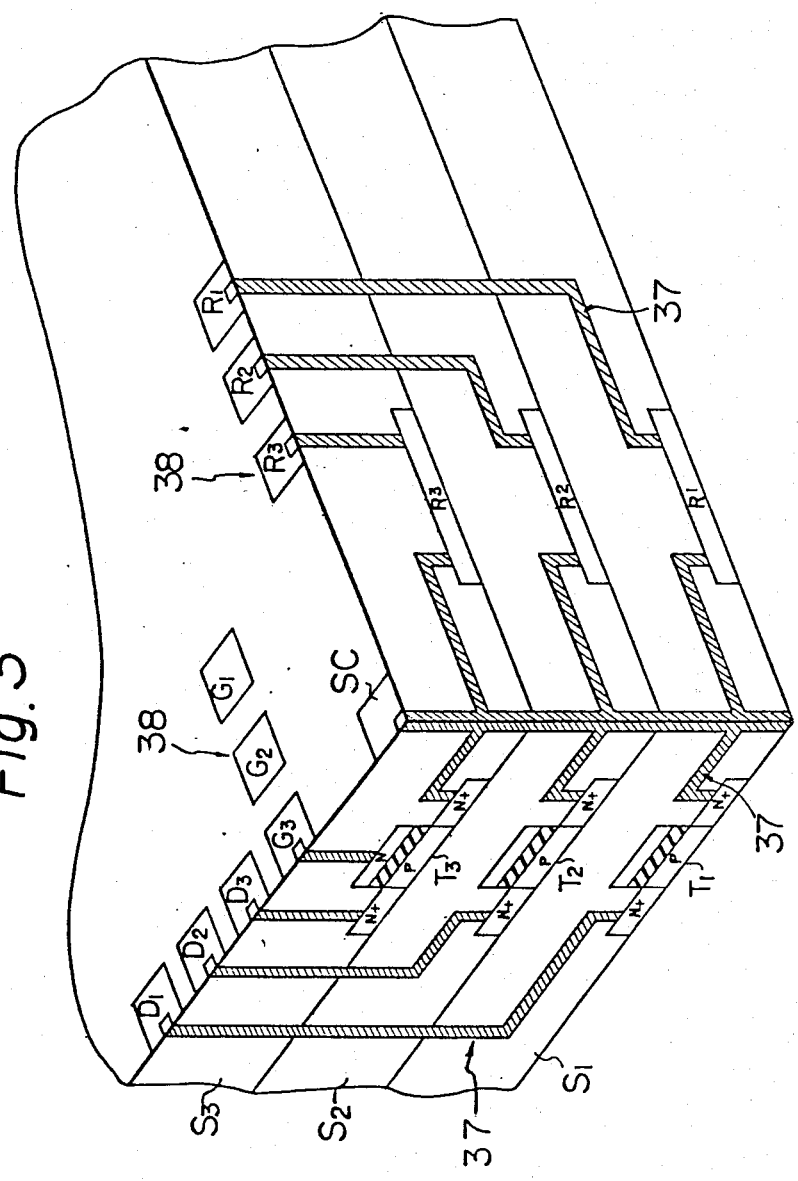
FIG. 3 is an alternate embodiment of the monitoring device of FIG. 1.
Figure 5:
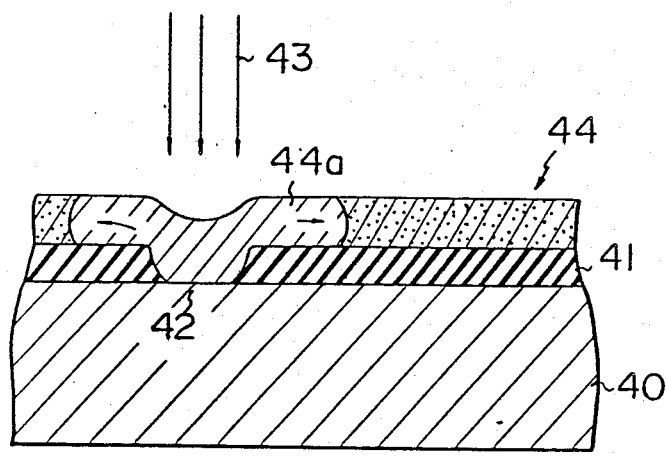
FIGS. 5 through 8 illustrate the steps of producing a three-dimensional LSI semiconductor device.

According to the present invention, the monitoring devices may be connected to one another by conductors formed between the selected semiconductor layers, as will be understood from the descriptions with reference to FIGS. 3 and 4.

A monitoring device is manufactured in each of the first, second and third semiconductor layers $S_1$, $S_2$, and $S_3$, respectively, as shown in FIG. 3, and the monitoring devices are connected to each other, as shown in FIG. 4, so that the MOS transistors and diffusion resistors of the three semiconductor layers can be evaluated as a whole. In FIG. 3, the insulating films are not specifically shown. The symbols $T_1$, $T_2$, and $T_3$ (FIGS. 1 and 3) indicate the MOS transistors of the first, second, and third semiconductor layers $S_1$, $S_2$, and $S_3$ respectively, and a subscript of a symbol indicates the number of the semiconductor layer. The symbols R, D, and G indicate the diffusion resistors, the drain of the MOS transistors, and the gate of the MOS transistors, respectively. The MOS transistors $T_1$, $T_2$, and $T_3$ are provided in common with a source SC. Reference numeral 37 indicates conductors comprising $MoSi_2$ or highly doped silicon, and pads 38 are connected to the ends of the conductors 37. The symbols $D_1$, $D_2$, $D_3$, $G_1$, $G_2$, $G_3$, $R_1$, $R_2$, and $R_3$ shown in the pads 38 indicate the semiconductor elements with which the pads 38 are connected.

By using the monitoring devices shown in FIGS. 3 and 4, the circuit function of the MOS transistors $T_1$, $T_2$, and $T_3$ and the diffusion resistors $R_1$, $R_2$, and $R_3$, is evaluated when the first, second and third semiconductor layers $S_1$, $S_2$, and $S_3$ are formed. Then the fourth insulating film (not shown) is selectively removed so as to expose the pads 38. As a result of such evaluation, it is determined whether or not the circuit function of the MOS transistors $T_1$, $T_2$, and $T_3$ and the diffusion resistors $R_1$, $R_2$, and $R_3$, if normal as a whole.

It is determined, based on the reliability of the production process and the efficiency of producing three-dimensional LSI semiconductor devices, whether the circuit function of the semiconductor elements should be evaluated for each semiconductor layer before carrying out the next step, as illustrated in FIG. 2, or whether the circuit function of the semiconductor elements of each of the selected semiconductor layers should be evaluated as a whole, as illustrated in FIGS. 3 and 4. However, it is not practical to evaluate the circuit function of the semiconductor elements of four or more semiconductor layers as a whole.

According to an embodiment of the present invention, a plurality of chips is formed on the substrate in the form of a matrix, scribe lines are formed between the chips, and a monitoring device is manufactured in a selected portion of the scribe lines. It is also possible to form monitoring devices both on the scribe lines and in the chips.

According to an embodiment of the present invention, a monitoring device is manufactured in each chip in which the semiconductor elements of a three-dimensional LSI semiconductor device is manufactured. The monitoring device and the three dimensional LSI semiconductor device are arranged beside one another in each chip.

According to an embodiment of the present invention, the monitoring device may be manufactured in only selected semiconductor layers, for example, one of the three successive semiconductor layers. This embodiment can be employed for producing three-dimensional LSI semiconductor devices when the production process is highly reliable and must be highly efficient.

The process of production of three-dimensional LSI semiconductor devices according to the present invention, which positively aims to enhance the reliability of LSI semiconductor devices, is first described without reference to the drawings.

Conventionally, two-dimensional LSI semiconductor devices are frequently produced by a process which includes a step of implanting impurity ions, a step of annealing the implanted impurity ions, and a silicon thermal oxidation step for forming the gate of MOS transistors. The annealing step and silicon thermal oxidation step are heat treatment steps.

If these heat treatment steps are used in the production of three-dimensional LSI semiconductor devices, the semiconductor layer or layers which are formed in the early stage of production undergo many more heat histories or cycles than those formed in a later stage of production. Thus, disadvantageously, the diffusion layers spread vertically and horizontally, the impurity ions are excessively diffused, and carrier concentration is decreased.

In addition three-dimensional LSI semiconductor devices are desirably produced by a process which is based on impurity-ion implantation because such implantation allows the concentration and depth of the impurities to be easily controlled and, further, is appropriate for increasing the integration of three-dimensional LSI semiconductor devices. The step of annealing the implanted impurity ions is, therefore, indispensable for activating the impurity ions, which activation creates the necessity of eliminating the disadvantages mentioned above. It is also necessary to eliminate the disadvantages resulting from the silicon thermal oxidation step for forming the gate of MOS transistors because a high thermal oxidation temperature of 1000° C. is detrimental for the production of three-dimensional LSI semiconductor devices. If a low thermal oxidation temperature is used for forming the gate of MOS transistors, the time necessary for forming the gate becomes too long to ensure a small surface state and a high breakdown voltage of the gate.

According to a preferred embodiment of the present invention which eliminates the disadvantages mentioned above, there is provided a process for producing a three-dimensional LSI semiconductor device further comprising the steps of: forming the impurity regions of the semiconductor elements by means of ion implantation; activating the immplanted impurity ions by irradiation with an energy beam; and forming the insulating material regions of the semiconductor components by means of high-pressure oxidation.

According to another preferred embodiment, there is provided a process for producing a three-dimensional LSI semiconductor device, further comprising the steps of: forming the impurity regions of the semiconductor components by means of ion implanation; activating the implanted impurity ions by irradiation with an energy beam; and forming an oxide film of the insulating material regions of the semiconductor elements by means of low-temperature sputtering.

Now referring to FIGS. 5 through 9, a preferred embodiment for producing a three-dimensional MOS IC is described. In this embodiment, impurity regions are formed by ion implantation, single cyrstallization is carried out by means of energy beam irradiation, and the monitoring device is formed in a selected portion of the scribe lines.

A single cyrstalline silicon substrate 40 (FIG. 5), i.e., the substrate, is covered with an insulating film 41 by means of a known method for forming silicon dioxide. The single crystalline silicon substrate 40 is partly exposed at the scribe lines, one of which 42 is shown. A P-type polycrystalline silicon layer 44 is deposited on the entire insulating film 41. An energy beam 43 is subsequently irradiated on a portion of the P-type polycrystalline silicon layer 44 so that single crystallization of the layer 44 starts from the nucleus, which is the exposed single crystalline substrate 40, and a single crystal grows in the direction of the arrows. The thus-formed single crystal is denoted by 44a.

Figure 6:
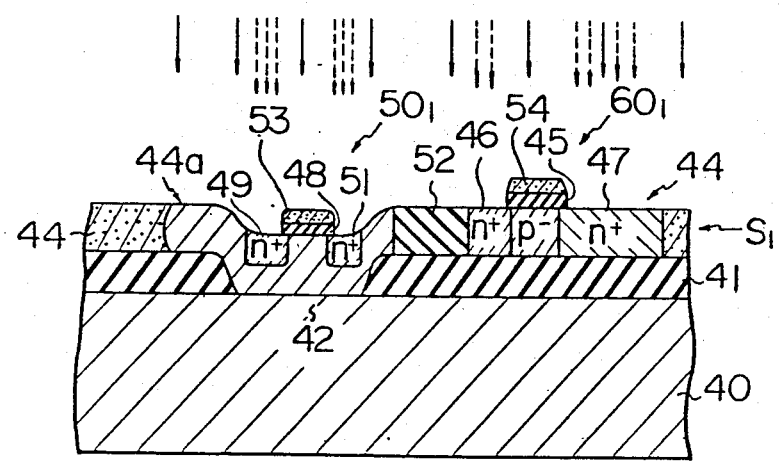

In the single crystal 44I a, a monitoring MOS transistor 50 and an ordinary MOS transistor 60, for the first semiconductor layer $S_1$, are manufactured as described hereinafter with reference to FIG. 6. First, a field oxide film 52, gate oxide film 45 and 48, and polycrystalline silicon electrodes 53 and 54 are formed. Arsenic ions ($As^+$) are then implanted, as shown by the solid arrows, in the entire first semiconductor layer $S_1$, previously selectively covered with a mask (not shown). Predetermined regions of the first semiconductor layer $S_1$ are then subjected to energy beam scanning (dotted arrows) so as to redistribute and activate the implanted arsenic ions ($As^+$). As a result, source regions 46 and 49 and drain region 47 and 51 are formed.

Figure 7:
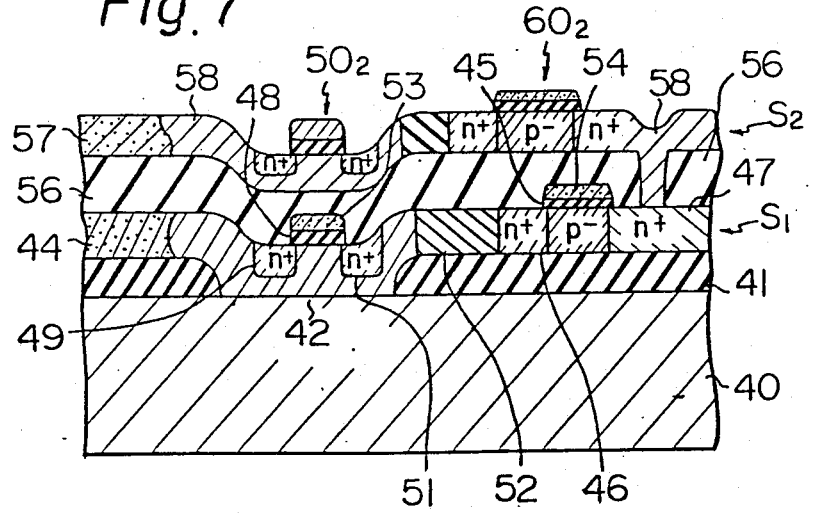

Subsequently, as shown in FIG. 7, an insulating film 56, which insulates the upper and lower semiconductor layers, is formed on the first semiconductor layer $S_1$ but the portion of the single crystalline semiconductor layer 40 which is used as the nucleus for single crystallization is exposed at the scribe line 42. A P-type polycrystalline silicon layer 57 is then deposited on the entire first semiconductor layer $S_1$ and is converted to a single crystal 58. For single crystallization of the layer 57, an energy beam and the exposed part of the single crystalline silicon substrate 40 are used in a manner similar to that in the formation of the first semiconductor layer $S_1$. The semiconductor elements of the second semiconductor layer $S_2$, i.e., a monitoring MOS transistor $50_2$ and an ordinary MOS transistor $60_2$, are manufactured in a manner similar to that of transistors $50_1$ and $60_1$. The parts of these transistors are not numbered because they are the same as those of the monitoring MOS transistor $50_1$ and the ordinary MOS transistor $60_1$.

Figure 8:
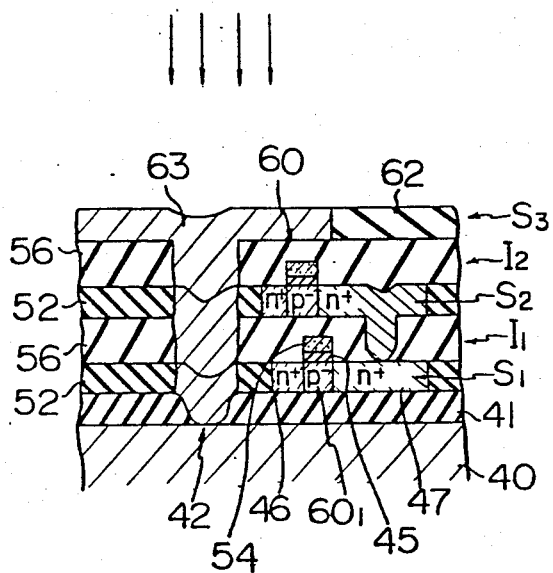

The formation of a third semiconductor layer $S_3$ is illustrated in FIG. 8 which shows a cross section of the multilayer semiconductor device where the monitoring MOS transistors $50_1$ and $50_2$ are not manufactured. A P-type polycrystalline silicon layer 62 is converted to a single crystal 63 by using as the nucleus the exposed single crystalline silicon substrate 40 and by irradiation of the energy beam 43.

Obviously, the portion of single crystal 44a where the monitoring MOS transistor $50_1$ is formed cannot be used as the nucleus of the single crystal 44a. The scribe line 42 which does not include the monitoring MOS transistor $50_1$ can be used as a nucleus of single crystallization. It is preferable to manufacture monitoring devices either in the vertical and horizontal scribe lines (not shown) and to use the other vertical and horizontal scribe lines as a nucleus of single crystallization.

The portions of a semiconductor layer, e.g., the first semiconductor layer $S_1$, which are subjected to the activation of implanted impurity ions are the source regions 46 and 49, the drain regions 47 and 51, and the polycrystalline silicon electrodes 53 and 54. These portions are annealed after forming each of the semiconductor layers, i.e., the first, second, and third semiconductor layers $S_1$, $S_2$, and $S_3$, respectively and are locally and instantaneously heated by an electron beam, an ion beam, a laser beam, a xenon flash lamp ray, or other energy beams.

According to the experiments of the present inventors, impurity-ion implantation and subsequent annealing under the following conditions resulted in neither vertical nor horizontal spreading of impurities and in no decrease in the carrier concentration in three-dimensional LSI semiconductor devices.

Impurity-ion implantation: $As^+$ ions and dose of $2 \times 10^{15}$ cm$^{-2}$

Annealing: CW Ar$^+$ laser, output 5W, and scan speed 10 cm/sec,

The field oxide film 52 (FIGS. 6 through 9) and the gate oxide films 45 and 48 can be formed by high pressure oxidation, which allows the oxide films to be formed at a low temperature and in a short period of time.

According to the experiments of the present inventors, a 50 nm-thick oxide film could be grown under the following conditions while avoiding the exertion of appreciable thermal influences on all of the semiconductor layers of the three-dimensional LSI semiconductor devices except for the top layer.

Pressure: 25–150 kg/cm$^2$
Heat Treatment: 700° C. for 180 minutes

Figure 9:
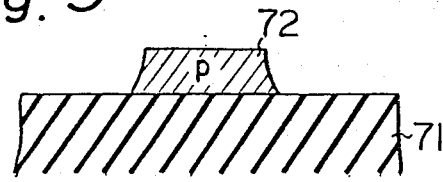
FIGS. 9 through 11 illustrate the steps of producing a first semiconductor layer of a three-dimensional metal-oxide semiconductor integrated circuit (MOS IC) regarding an embodiment of the present invention in which a silicon dioxide film is formed by means of low-temperature sputtering deposition.
Figure 10:
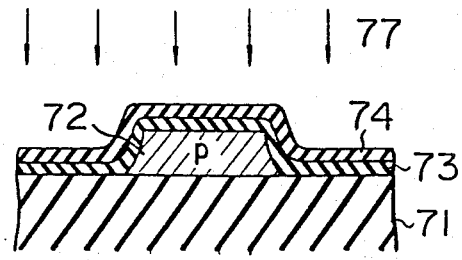
Figure 11:
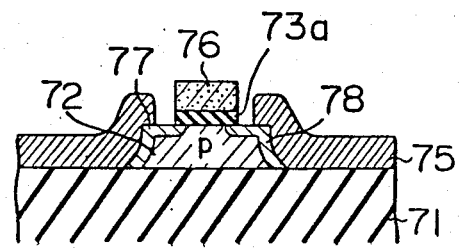

In FIGS. 9 through 11, a preferred embodiment of the present invention for producing a three-dimensional MOS IC is illustrated.

First, as shown in FIG. 9, a single crystalline semiconductor layer 72 is formed on an insulating body 71, which comprises silicon dioxide and which is the substrate of the MOS IC. The single crystalline semiconductor layer 72 is isolated from the other single crystalline semiconductor layers (not shown) by air isolation. Impurity ions are implanted in the single crystalline semiconductor layer 72 and then the surface of the layer 72 is subjected to slight etching by ions which are bombarded onto the surface by means of sputtering. Subsequently, a silicon dioxide film 73 is formed by means of low-temperature sputtering. The temperature for formation of the silicon dioxide film 73 is from 400° C. to 500° C., which is obviously lower than that in the case of thermal oxidation and is even lower than that in the case of chemical vapor deposition. Low-temperature sputtering allows the silicon dioxide film 73 to be formed at a rapid growth rate.

According to the experiments of the present inventors, the 70 nm-thick silicon dioxide film 73 was formed at a growth rate of from 10 to 20 nm/minute when the insulating body 71 was not intentionally heated (room temperature).

A silicon nitride film 74 (FIG. 10) was then formed by means of low-temperature sputtering.

According to the experiments of the present inventors, the 100 nm-thick silicon nitride film 74 comprising $Si_3N_4$ was formed at a growth rate of from 100 to 200 nm per second when the insulating body 71 was not intentionally heated.

Halogen ions, such as Cl$^+$ or F$^+$ were ion-implanted in the entire first single crystalline semiconductor layer 72, as indicated by the arrows 77, so as to improve the electrical properties of the MOS transistor.

Due to the ion implantation of halogen ions, the gettering of movable impurity ions in the silicon dioxide film 73, as well as the generation of crystal defects in the first single crystalline semiconductor layer 72, can be suppressed. Activation of the implanted halogen ions is desirably carried out by an energy beam, such as a laser beam, an electron beam, an ion beam, a focusing flash lamp, etc., because by using such an energy beam local and instantaneous heating with the smallest possible thermal effect can be achieved. A preferable energy beam is an ultraviolet laser-ray beam.

According to the experiments of the present inventors, the following ion implantation and ion activation conditions are preferable:

Chlorine ion (Cl$^+$ ion): dose of from $10^{13}$ to $10^{15}$ Cl$^+$/cm$^2$, $1 \times 10^{14}$ Cl$^+$/cm$^2$.

Laser beam: CW Ar$^+$ laser having an output of 5W, a scanning speed of 10 cm/min, and a lens having a focal length (f) of 25 mm.

The silicon dioxide film 73 is selectively removed, as shown in FIG. 10, by using a silicon nitride film (not shown), and the remaining silicon dioxide film 73 is used as a gate oxide film 73a (FIG. 11). A crystalline silicon electrode 76 is formed on the gate oxide film 73a. Next, arsenic ions (As$^+$) as donor impurities implanted and then are activated by laser annealing so as to form a source region 77 and a drain region 78 in the first single crystalline semiconductor layer 72. Leads 75 are finally formed, and the first semiconductor layer is completed. On the first semiconductor layer, an insulating film (not shown) comprising silicon dioxide or the like is formed, and the second single crystalline semiconductor layer is formed in the same manner as described with reference to FIGS. 9 through 11. The above-described steps are repeated so as to complete the three-dimensional MOS IC while suppressing to a minimum extent the effects of heat treatments required for successively forming each of the semiconductor layers.

Figure 12:
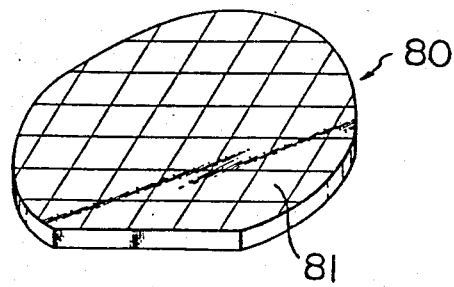
FIG. 12 is a three-dimensional LSI wafer.

A three-dimensional LSI wafer 80 shown in FIG. 12 comprises a number of three-dimensional LSI semiconductor devices in which the semiconductor layers are isolated from each other by insulating films. And the semiconductor elements of the semiconductor layers are electrically connected in layers via conduction channels, such as through holes, which are formed through the insulating films. If the three-dimensional LSI wafer 80 is subjected to hydrogen annealing, which is known in the production of a conventional two-dimensional LSI semiconductor device, as a final step for stabilizing the interface state between insulating film and a semiconductor layer, stabilization of the surface state can be achieved at only limited portions of the three-dimensional LSI wafer 80 where hydrogen can satisfactorily penetrate the wafer 80, that is, the peripheral portion and top portion of the three-dimensional LSI wafer 80. Hydrogen penetration becomes difficult when the diameter of the three-dimensional LSI wafer 80 is great and when the three-dimensional LSI wafer 80 has a large number of semiconductor layers. Furthermore, the penetration of hydrogen through silicon nitride, which may be used as an insulating film, is difficult. Practically, hydrogen can only penetrate into the peripheral portion of the three dimensional LSI wafer 80.

Figure 13:
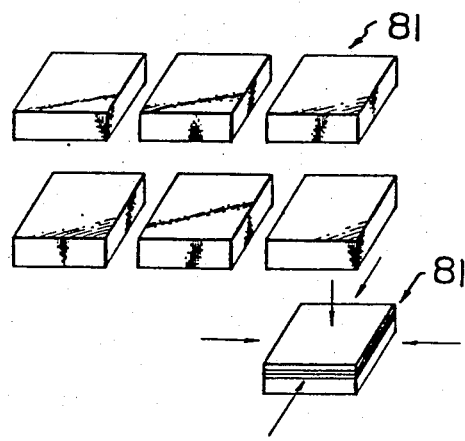
FIG. 13 is a hydrogen annealing process of individual three-dimensional LSI semiconductor devices.

According to a preferred embodiment of the present invention, the three-dimensional LSI wafer 80 is divided into individual three-dimensional LSI semiconductor devices 81, each device being in the form of a chip, as shown in FIG. 13, or into several groups of three-dimensional LSI semiconductor devices 81. Thereafter, the individual three-dimensional LSI semiconductor devices 81 or the several groups of three-dimensional LSI semiconductor devices 81 are hydrogen-annealed. The hydrogen can penetrate into the individual three-dimensional LSI semiconductor devices 81 in the directions of the arrows; that is, through the top surface and the side surfaces of the individual three-dimentional LSI semiconductor devices 81. Hydrogen can even penetrate into the central portion of the individual three-dimensional LSI semiconductor devices 81, which may include difficult-to-penetrate silicon nitride films, because the size of the individual three-dimensional LSI semicondcutor devices 81 is considerably smaller than that of the three-dimensional LSI wafer 80. Instead of dividing the three dimensional LSI wafer 80, the wafer 80 may be grooved or serrated so as to expose the substrate (not shown) and the side surfaces of the individual three-dimensional LSI semiconductor 81.

I claim:

1. A process for producing a semiconductor device comprising a substrate, first and second semiconductor layers formed on the substrate, and an insulating film formed between the first and second semiconductor layers for insulating the first and second semiconductor layers from one another, the process comprising the steps of:
   (a) preparing the substrate;
   (b) forming the first semiconductor layer on the substrate;
   (c) forming a first group of circuit elements, including a plurality of first semiconductor elements, in the first semiconductor layer;
   (d) forming a first monitoring device, for monitoring the properties of the first group of circuit elements, on the first semiconductor layer;
   (e) measuring the properties of the first monitoring device, thereby evaluating a circuit function of the first semiconductor elements;
   (f) forming the insulating film on the first semiconductor layer;
   (g) forming the second semiconductor layer on the insulating film;
   (h) forming a second group of circuit elements, including a plurality of second semiconductor elements, in the second semiconductor layer;
   (i) forming a second monitoring device on the second semiconductor layer;
   (j) forming a conductor, extending through the insulating film, for electrically connecting the first monitoring device in the first semiconductor layer with the upper surface of the second semiconductor layer; and
   (k) measuring the properties of the first monitoring device via the conductor.

2. A process according to claim 1, wherein said measuring step (d) is performed before said forming step (f).

3. A process according to claim 1, further comprising the steps of:
   forming a plurality of chips on the first layer in the form of a matrix; and
   forming the first monitoring device in at least one of the plurality of chips.

4. A process according to claim 1, further comprising the steps of:
   forming a plurality of chips on the first layer in the form of a matrix;
   forming vertical and horizontal scribe lines between the chips; and
   forming the first monitoring device on a selected portion of the scribe lines.

5. A process according to claim 1, wherein said steps (c) and (h) each comprise the substeps of:
   forming impurity regions in the first and second semiconductor elements by means of ion implantation; and
   activating the implanted impurity ions by irradiation with an energy beam, and wherein said step (f) comprises forming the insulating film on the first semiconductor elements by means of high-pressure oxidation.

6. A process according to claim 1, wherein said steps (c) and (h) each comprise the substeps of:
   forming impurity regions in the first and second semiconductor elements by means of ion implanation; and
   activating the implanted impurity ions by irradiation with an energy beam, and wherein said step (f) comprises forming an oxide film, as the insulating film on the first semiconductor elements, by means of low-temperature sputtering.

7. A process according to claim 5 or 6, whereing the first semiconductor layer has a single crystalline portion, further comprising the steps of:
   selectively removing and partly exposing the insulating film so as to expose the single crystalline portion of the first semiconductor layer;
   forming a polycrystalline semiconductor layer on the insulating film; and
   carrying out single crystallization of the polycrystalline semiconductor layer, using as a nucleus the single crystalline portion of the first semiconductor layer, by selectively irradiating selected portions of the polycrystalline semiconductor layer with an energy beam.

8. A process according to claim 3 or 4, wherein each of the plurality of chips has side surfaces, further comprising the steps of:
   partly exposing the side surface of the plurality of chips; and
   heating the plurality of chips in a hydrogen atmosphere.

9. A process for producing a semiconductor device having a substrate, comprising the steps of:
   (a) forming a first semiconductor layer on the substrate;
   (b) forming a first group of circuit elements, including first semiconductor elements, in the first semiconductor layer;
   (c) forming a first monitoring device, for monitoring the first group of circuit elements, on the first semiconductor layer;
   (d) forming a first insulating layer on the first semiconductor layer;
   (e) forming a second conductor layer on the first insulating layer;

(f) forming a second group of circuit elements, including second semiconductor elements, in the semiconductor layer;
(g) forming a second monitoring device, for monitoring the second group of circuit elements, on the second semiconductor layer;
(h) forming a conductor, extending through the insulating layer, for electrically connecting the first monitoring device to the upper surface of the second semiconductor layer; and
(i) measuring the properties of the first monitoring device via the conductor.

* * * * *

UNITED STATES PATENT AND TRADEMARK OFFICE
CERTIFICATE OF CORRECTION

PATENT NO. : 4,489,478
DATED : DECEMBER 25, 1984
INVENTOR(S) : JUNJI SAKURAI

It is certified that error appears in the above-identified patent and that said Letters Patent is hereby corrected as shown below:

Col. 4, line 22, "$S_3$" should be --$S_3$,--;

line 44, "if" should be --is--.

Col. 5, line 58, "immplanted" should be --implanted--.

Col. 6, line 23, "44Ia," should be --44a,--.

Col. 7, line 25, "sec," should be --sec.--;
line 53, "silicn" should be --silicon--.

Col. 8, line 23, "$cm^2$," should be --$cm^2$, preferably--;
line 29, "A crystalline" should be --A polycrystalline--.

Col. 9, line 22, "semicondcutor" should be --semiconductor--

Col. 10, line 34, "whereing" should be --wherein--;
line 51, "surface" should be --surfaces--.

Signed and Sealed this

Twenty-third Day of July 1985

[SEAL]

Attest:

DONALD J. QUIGG

Attesting Officer    Acting Commissioner of Patents and Trademarks